United States Patent
De Nivelle et al.

(10) Patent No.: US 12,339,594 B2
(45) Date of Patent: Jun. 24, 2025

(54) SUBSTRATE LEVEL SENSING IN A LITHOGRAPHIC APPARATUS

(71) Applicant: ASML Netherlands B.V., Veldhoven (NL)

(72) Inventors: Martin Jules Marie-Emile De Nivelle, Waalre (NL); Jori Selen, Eindhoven (NL); Marcel Bontekoe, Neerpelt (BE); Doru Cristian Torumba, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 98 days.

(21) Appl. No.: 18/032,448

(22) PCT Filed: Sep. 20, 2021

(86) PCT No.: PCT/EP2021/075812
§ 371 (c)(1),
(2) Date: Apr. 18, 2023

(87) PCT Pub. No.: WO2022/083954
PCT Pub. Date: Apr. 28, 2022

(65) Prior Publication Data
US 2023/0384698 A1 Nov. 30, 2023

(30) Foreign Application Priority Data
Oct. 20, 2020 (EP) .................................... 20202724

(51) Int. Cl.
*G03F 7/00* (2006.01)
*G03F 9/00* (2006.01)

(52) U.S. Cl.
CPC ........ *G03F 9/7034* (2013.01); *G03F 7/70725* (2013.01)

(58) Field of Classification Search
CPC .......................... G03F 7/70725; G03F 9/7034
See application file for complete search history.

(56) References Cited

U.S. PATENT DOCUMENTS 6,952,253 B2    10/2005    Lof et al.
2004/0257545 A1    12/2004    Brinkhof et al.
(Continued)

FOREIGN PATENT DOCUMENTS

JP    H06-5495 A    1/1994
JP    2019-008029 A    1/2019
WO    WO 2016/102127 A1    6/2016

OTHER PUBLICATIONS

Machine translation of JP 2019-008029, Jan. 17, 2019.*
(Continued)

*Primary Examiner* — Peter B Kim
(74) *Attorney, Agent, or Firm* — Sterne, Kessler, Goldstein & Fox P.L.L.C.

(57) ABSTRACT

A lithographic apparatus is disclosed. The lithographic apparatus comprises a substrate table configured to support a substrate; actuators configurable to move the substrate table in a plane substantially parallel to the surface of the substrate; a projection system configured to pattern the substrate with fields aligned in a scanning exposure direction; a level sensor configured to sense a height of the substrate using a plurality of measurement spots; and a controller configured to control the actuators to generate strokes of relative movement between the substrate and the level sensor for mapping the height of the substrate, said strokes being at an angle of less than 20 degrees relative to the scanning exposure direction. Also disclosed is an associated method of mapping the height of a substrate.

13 Claims, 7 Drawing Sheets

(56) References Cited

U.S. PATENT DOCUMENTS

| | | |
|---|---|---|
| 2005/0128454 A1* | 6/2005 | Ina .................. G03F 9/7011 |
| | | 355/55 |
| 2009/0231563 A1 | 9/2009 | Staals et al. |
| 2010/0103393 A1 | 4/2010 | Motojima |
| 2011/0109889 A1 | 5/2011 | Van De Vin et al. |

OTHER PUBLICATIONS

International Search Report and Written Opinion of the International Searching Authority directed to International Patent Application No. PCT/EP2021/075812, mailed Jan. 5, 2022; 11 pages.
Streefkerk et al., "Extending optical lithography with immersion," Proc. of SPIE, vol. 5377, Optical Microlithography XVII, May 28, 2004; pp. 285-305.

* cited by examiner

SUBSTRATE LEVEL SENSING IN A LITHOGRAPHIC APPARATUS

CROSS-REFERENCE TO RELATED APPLICATION

The application claims priority of EP application 20202724.9 which was filed on Oct. 20, 2020 and which is incorporated herein in its entirety by reference.

FIELD

The present invention relates to level sensing of substrates in a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

At one or more stages in a semiconductor manufacturing processes of lithography, a flatness of the substrate may be measured. Such a measurement may be performed at a plurality of locations on the substrate and stored as a height map. The height map may be used to position a relevant target portion of the substrate at an appropriate height, such that when projecting a pattern onto the target portion of the substrate, said target portion is positioned within a required focal range of a projection system, e.g., a projection lens, of the lithographic apparatus.

Determining the height map may be known in the art as "level sensing". The level sensing may be performed using a level sensor. The level sensor may be integral to a lithographic apparatus or may be a separate measurement apparatus. For example, the level sensor may make use of an optical measurement, by means of projecting a measurement beam onto the substrate and detecting a reflection thereof.

The substrate to be sensed may be moved relative to the level sensor to enable the height of the surface of the substrate to be measured at a plurality of locations, and thus stored as a height map. Typically the substrate can be moved in at least an x-direction and in a y-direction orthogonal to the x-direction, wherein the x- and y-directions are in a plane substantially parallel to the surface of the substrate. In such a case, the height is variable in the z-direction.

However, the height map has a limited resolution in at least one direction, e.g. the x-direction. For example, a resolution of the height map in the x-direction may be determined by a pitch between the measurement spots of the level sensors and the size of the measurement spots. As such, the level sensor may be effectively blind to any topological features residing within a space between neighboring measurement spots. Significant topological features of the substrate that are not detected by level-sensing may result in an error in a calculated height of the substrate for projecting the pattern onto the target portion within the required focal range.

Furthermore, as level sensing and any subsequent height adjustments of the substrate are part of a mass-production semiconductor manufacturing process, it is imperative that said level-sensing is of a relatively short duration.

It is therefore desirable to provide a highly sensitive level-sensing means that is capable of detecting all significant topological features, and suitable for integration into a mass-production semiconductor manufacturing process.

It is therefore an aim of at least one embodiment of at least one aspect of the present disclosure to obviate or at least mitigate at least one of the above identified shortcomings of the prior art.

SUMMARY

According to a first aspect of the disclosure, there is provided a lithographic apparatus comprising: a substrate table configured to support a substrate; actuators configurable to move the substrate table in a plane substantially parallel to the surface of the substrate; a projection system configured to pattern the substrate with fields aligned in a scanning exposure direction; a level sensor configured to sense a height of the substrate using a plurality of measurement spots; and a controller configured to control the actuators to generate strokes of relative movement between the substrate and the level sensor for mapping the height of the substrate, said strokes being at an angle of less than 20 degrees relative to the scanning exposure direction.

Advantageously, by having the strokes of the level sensor at an angle relative to the scanning exposure direction, a deep scribe line and/or significant topological feature of the fields that runs parallel to the scanning exposure direction may be detected. That is, with prior art level sensing techniques, such topological features may have been missed by the measurement spots of the level sensor scanning parallel to such features, but shifted to the left or right side of the feature in a direction orthogonal to the scanning exposure direction. However, due to the disclosed angle of the level sensor stroke relative to the scanning exposure direction, repeating device topology of the fields is measured at a plurality of different x-positions by at least one level-sensor measurement spot. As such, a height map of the substrate may be determined wherein deep scribe lines or significant topological features running parallel to the scanning exposure direction are more reliably detected.

Furthermore, by using such slanted measurement spots and by combining measurements of all fields it is possible to reconstruct the device topology, e.g. a height map, with a resolution having a smaller pitch than the pitch between the LS spots.

Advantageously, applying an effective slant to the stroke of the level sensor relative to the scanning exposure direction provides a quicker means to map a height of a substrate than alternatively adjusting or modulating the strokes in a direction orthogonal to the scanning exposure direction to ensure the entire surface of the substrate is mapped, e.g. any pitch between measurement spots is also mapped.

Advantageously, by applying a relatively small angle of less than 20 degrees, the substrate table and actuator hardware may require no significant hardware modification to implement the disclosure, as a substrate table may typically have means to perform small rotational adjustments to a position of a substrate to account for errors in placement of the substrate on the substrate table.

Advantageously, by applying a relatively small angle of less than 20 degrees, an overall time taken to map a height of a substrate may be minimally affected.

Each one of the strokes may be substantially parallel to each other one of the strokes.

At least one of the actuators may be configured to rotate the substrate table such that said strokes are at the angle of less than 20 degrees relative to the scanning exposure direction. Rotation of the substrate may advantageously enable improved filtering of vibrational noise in height measurements.

A. position of the strokes in a first direction orthogonal to the scanning exposure direction may vary by between 1 and 4 times a pitch between each of the plurality of measurement spots, over a length of the substrate table or over a length of the substrate A position of the strokes in a first direction orthogonal to the scanning exposure direction may vary by between 1 and 2 times a pitch between each of the plurality of measurement spots, over a length of the substrate table or over a length of the substrate.

The controller may be configured to control the plurality of actuators to move the substrate table relative to the level sensors in the scanning exposure direction faster than the plurality of actuators is configured to move the substrate table relative to the level sensors in the first direction.

The controller may be configured to vary a position of the strokes in a/the first direction orthogonal to the scanning exposure direction between consecutive strokes.

The angle may be less than 1 degree.

According to a second aspect of the disclosure, there is provided a method of mapping the height of a substrate, the method comprising controlling actuators to generate strokes of relative movement between a substrate supported by a substrate table and a level sensor for mapping the height of the substrate using a plurality of measurement spots, said strokes at an angle of less than 20 degrees relative to fields aligned on the substrate in a scanning exposure direction.

The method may comprise a step of combining a plurality of measurements of the height of the substrate to reconstruct a topology of the substrate and/or to compute an intra-field fingerprint.

Each one of the strokes may be substantially parallel to each other one of the strokes.

The method may comprise a step of rotating the substrate table such that said strokes are at the angle of less than 20 degrees relative to the scanning exposure direction.

The method may comprise a step of varying a position of the strokes in a first direction orthogonal to the scanning exposure direction by between 1 and 4 times a pitch between each of a plurality of measurement spots of the level sensor, over a length of the substrate table.

The method may comprise a step of varying a position of the strokes in a first direction orthogonal to the scanning exposure direction by between 1 and 2 times a pitch between each of a plurality of measurement spots of the level sensor, over a length of the substrate table.

The method may comprise a step of moving the substrate relative to the level sensor in the scanning exposure direction faster than the substrate is moved relative to the level sensor in the first direction.

The method may comprise a step of varying a position of the strokes in a/the first direction orthogonal to the scanning exposure direction between consecutive strokes.

According to a third aspect of the disclosure, there is provided a computer program product comprising instructions which, when the program is executed by a computer, cause the computer to control actuators to carry out the method of the second aspect.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF THE DRAWINGS

Embodiments of the invention will now be described, by way of example only, with reference to the accompanying schematic drawings, in which:

FIG. 3b depicts a simulated portion of a height map of the 3D NAND structure of FIG. 3a;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
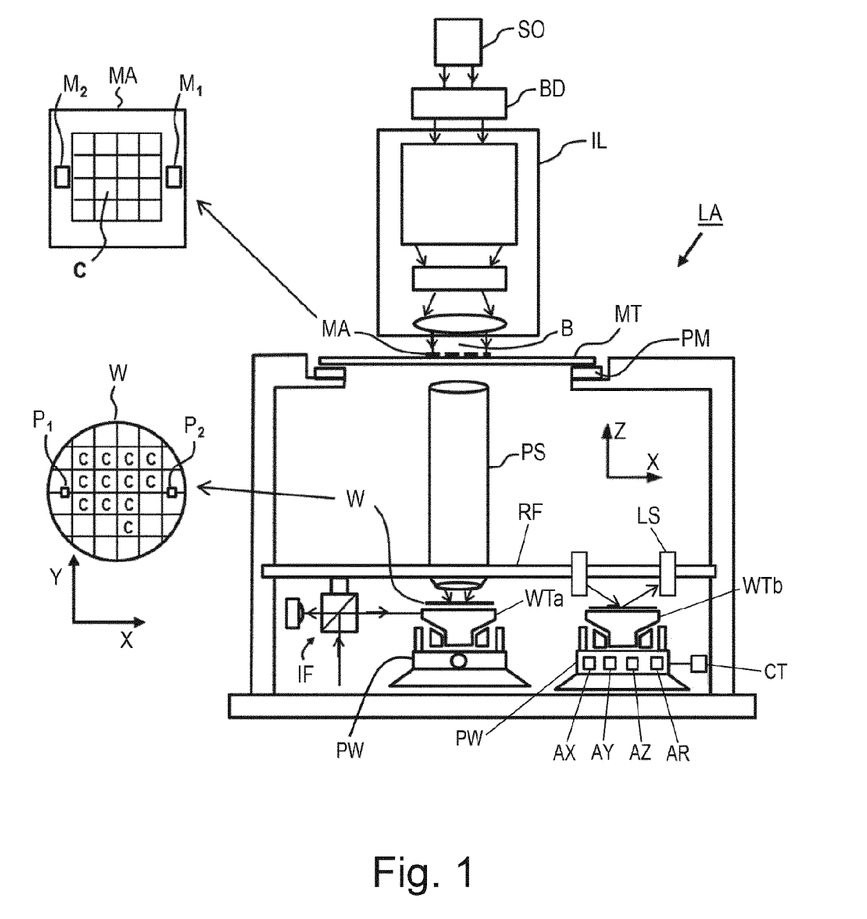
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, substrate tables (e.g., substrate supports or wafer tables) WTa, WTb each constructed to hold a substrate (e.g., a resist coated wafer) W and connected to a second positioner PW configured to accurately position the substrate table in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W— which is also referred to as immersion lithography. More information on immersion techniques is given in U.S. Pat. No. 6,952,253, which is incorporated herein by reference.

The example lithographic apparatus LA of FIG. 1 is of a type having two substrate tables WTa, WTb (also named "dual stage"). In such "multiple stage" machines, the substrate tables WTa, WTb may be used in parallel, and/or steps in preparation of a subsequent exposure of the substrate W may be carried out on the substrate W located on one of the substrate table WTa while another substrate W on the other substrate table WTb is being used for exposing a pattern on the other substrate W.

The preparation may include mapping the surface of the substrate using a level sensor LS and/or measuring the position of alignment markers on the substrate. The level sensor LS may be configured to determine a height map of a substrate. This height map may be used to correct the position of the substrate W during projection of a pattern on the substrate W. The level sensor LS may comprise a projection unit, a detection unit, and a controller. The projection unit comprises a light source providing one or more beam, as described in more detail below. In an example level sensor, the projection unit may be configured to direct one or more beams of radiation on to a surface of the substrate as one or more measurement spots, and the detection unit may be configured to detect a reflection of each of the one or more measurement spots. The reflected measurement spots may be used to determine information corresponding to a height of the substrate.

The substrate tables WTa, WTb may comprise, or be coupled to, one or more actuators for maneuvering the substrate W relative to the projection system PS. For example, the substrate tables WTa, WTb may comprise one or more of actuators AX, AY, AZ, AR for moving the substrate W in orthogonal x, y or z directions, or rotating the substrate in an R direction respectively. The actuators AX, AY, AZ, AR are be coupled to, and controlled by, a controller CT.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate table WTa/WTb can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axes, i.e., an x-axis, a y-axis and a z-axis. Each of the three axes is orthogonal to the other two axes. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
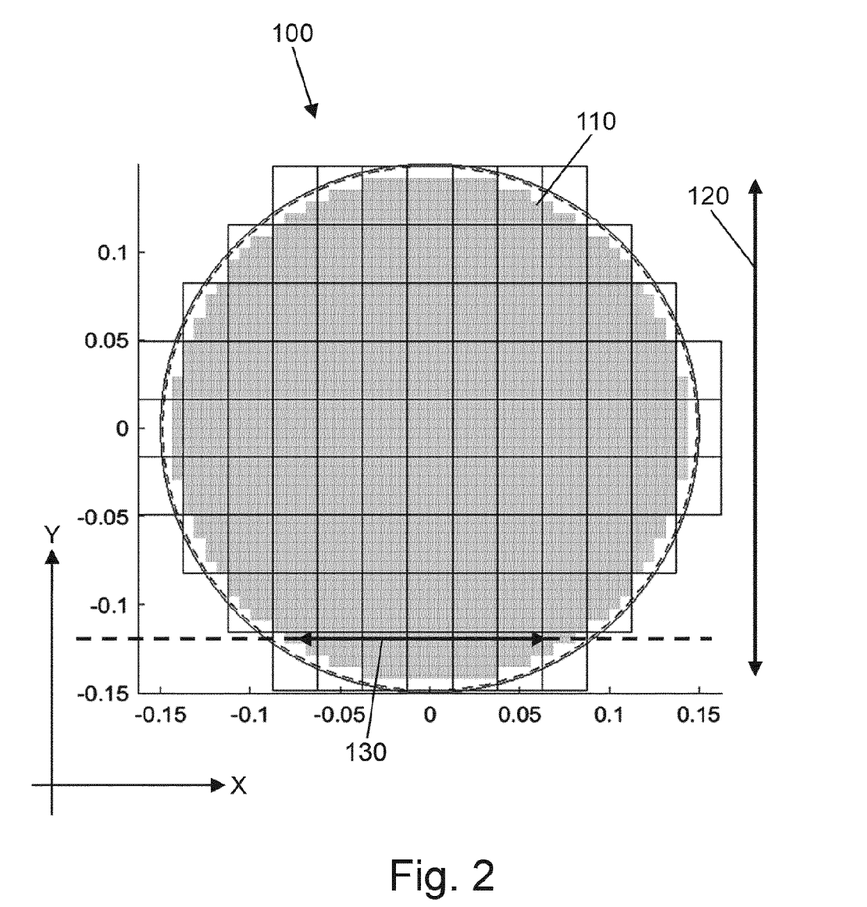
FIG. 2 depicts an example map of a substrate, showing directions of strokes of the level sensor relative to a scanning exposure direction.

FIG. 2 depicts an example map 100 of a substrate. The map 100 covers a plurality of fields 110, each field 110 being substantially quadrilateral in shape, and provided in a grid-like arrangement covering a majority of an overall surface of the substrate.

Each field 110 may correspond to a pattern, for example a pattern that has been projected onto the substrate using a radiation beam B as described above with reference to the substrate W and the projection system PS of FIG. 1. That is, each field 110 may correspond to at least one layer or portion of an integrated circuit or electronic device that has been patterned onto the substrate. In a typical lithographic process, each field 110 on the substrate is substantially identical to each other field. In some examples, each sub-set of fields is substantially identical to each other sub-set of fields.

As can be seen in FIG. 2, the fields 110 are arranged in a grid-like array such that a peripheral edge of each field is parallel to the x-axis and the y-axis of the horizontal plane.

As described above with reference to FIG. 1, the substrate tables WTa/WTb may be moved such that the substrate W may be consecutively patterned, wherein each field 110 is exposed at a designated target portion C. Generally, the fields may be pattered onto the substrate, wherein the fields are arranged in lines arranged along an axis known in the art as the "scanning exposure direction". For purposes of example, the y-direction corresponds to a scanning exposure direction throughout the remainder of this disclosure, although one of skill in the art will readily appreciate that the x-direction could alternatively correspond to the scanning exposure direction. In an example of a substrate exposure method, the substrate is patterned with a plurality of fields generally arranged in a scanning exposure direction and/or in a reverse of the scanning exposure direction.

The example map 100 corresponds to a substrate of approximately 300 millimetres diameter, generally referred to in the art as a "12" wafer". As such, FIG. 2 depicts the map 100 extending approximately +/−150 millimetres in each of the x-direction and y-direction from a centre point. It will be appreciated that the disclosed apparatus and methods are applicable to substrates of other dimensions, such as 150 millimeter, 200 millimeter, 450 millimeter and 675 millimeter diameter substrates.

A level-sensor, e.g. the level sensor LS as depicted in FIG. 1, may be used to sense the height of the substrate at a plurality of locations to form a topological map, known as a height map, of the substrate.

A controller, e.g. controller CT, may configure the actuators, e.g. actuators AX and AY, to generate strokes of relative movement between the substrate and the level sensor for mapping the height of the substrate. Arrow 120 depicts a direction of strokes of the level sensor. The strokes are in the scanning exposure direction, e.g. parallel to the y-axis.

Also depicted is an arrow 130 which depicts a calibration scan stroke. The calibration scan stroke is in a direction orthogonal to the scanning exposure direction, e.g. parallel to the x-axis. In a calibration phase of the level sensor, a single stroke may be performed in the X-direction. In the example of FIG. 2, the single calibration stroke is at a fixed position of y=−122 millimetres.

The level sensor may for example be configured to measure the height of the substrate using a plurality of measurement spots. As described above, the measurement spots may correspond to radiation emitted by a projection unit of the level sensor, and a detection unit of the level sensor may be configured to detect a reflection of each of the plurality of measurement spots from the surface of the substrate to determine a height of the substrate at the location of each of the measurement spots.

The plurality of measurement spots are separated by a defined pitch. In an example embodiment, the level sensor uses a given number of measurement spots, wherein each spot has a given width or diameter, and a gap length is provided between each spot. As such, a single stroke of the level sensor may measure a height of the substrate over a path having a width approximately equal to the sum of all spot widths and all gap lengths. Thus, the number of strokes required to scan a substrate of a given diameter can be calculated. It will be understood that the dimensions and number of measurement spots may vary, and embodiments falling within the scope of the disclosure may comprise few or many measurement spots, with different dimensions and pitches.

Continuing with the example embodiment described above, with the required number of strokes as calculated, the height of the complete surface of the substrate may be mapped. However, in some instances it is possible that within the gap length between each of the measurement spots, significant topological features of the substrate may not be mapped.

For example, a deep scribe line or a device structure that runs parallel to a stroke of the level sensor in the scanning exposure direction may not be detected. This is because such features may be missed by the measurement spots scanning parallel to such features, but shifted to the left or right side of the feature in the x-direction.

Turning again to the example of FIG. 2, the calibration stroke may be used to calibrate a response from each of the measurement spots. That is, by having a calibrating scan with a stroke parallel to the x-axis, different x-positions of the wafer can be sampled by all of the spots to ensure that they all respond the same way for a particular substrate topology. Therefore, if different responses are received from spots then the responses may be calibrated accordingly. Generally, it is preferred that such a calibration is performed only once, to minimise an amount of time required for level sensor calibration.

However, it may be the case that the calibration stroke runs along a deep scribe line or a device structure that extends in the x-direction across the substrate, thus potentially leading to an erroneous calibration.

Similarly, for strokes of the level sensor in the scanning exposure direction, it may be the case that a deep scribe line or a device structure runs substantially parallel to the scanning exposure direction but lies between measurement spots, and are therefore not detected, as described in more detail with reference to the examples of FIGS. 3a and 3b.

Figure 3A:
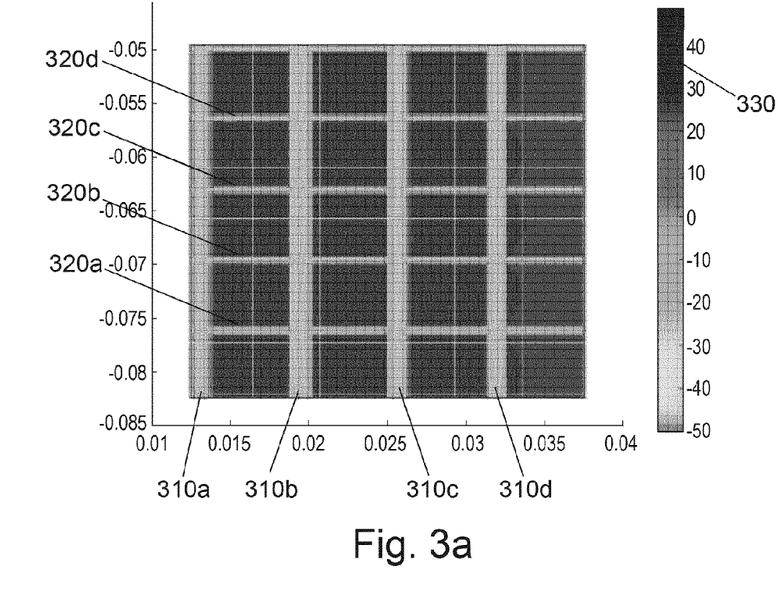
FIG. 3a depicts an example of a portion of a topology of a 3D NAND structure on a substrate.

FIG. 3a depicts an example of a portion of a topology of a 3D NAND structure on a substrate. The graded scale 330 represents surface height. The topology comprises a grid-like pattern of trenches (known in the art as "peri lines" or "peripheral lines"), formed from a plurality of vertical lines 310a, 310b, 310c, 310d intersecting a plurality of horizontal lines 320a, 320b, 320c, 320d. It can be seen that the vertical lines 310a, 310b, 310c, 310d and the horizontal lines 320a, 320b, 320c, 320d correspond to a different height from that of the areas enclosed by said lines.

Figure 3B:
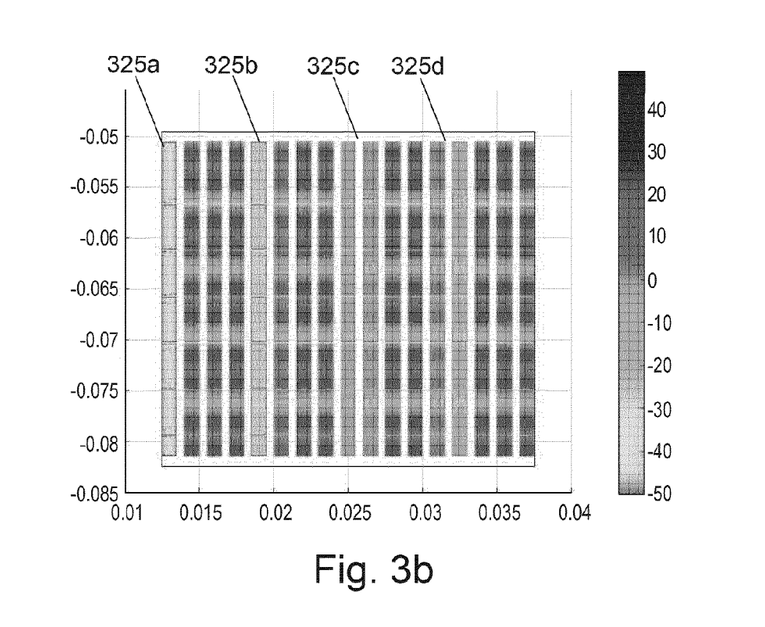

FIG. 3b depicts a simulated portion of a height map of the 3D NAND structure of FIG. 3a, as would be measured using a level sensor, e.g. the level sensor LS of FIG. 1. It can be seen that vertical lines 310a, 310b have clearly been detected, as indicated by the distinct contrast of shaded lines 325a, 325b and the regions either side.

It can also be seen that vertical lines 310*c*, 310*d* have been less clearly detected. This is apparent from the less distinct contrast of shaded lines 325*c*, 325*d* relative to adjacent regions. This is because the lines would coincide with the gap length between measurement sports of the level sensor. That is, the gap lengths between measurement spots of the level sensor effectively produce a blind-zone, wherein significant topological features such as the peri lines 320*c* and 320*d* are not sufficiently detected. As such, shaded lines 325*c*, 325*d* which correspond to vertical lines 320*c*, 320*d* are detected as being shallower in depth than vertical lines 310*a*, 310*b* which are indicated by shaded lines 325*a*, 325*b*.

Figure 4A:
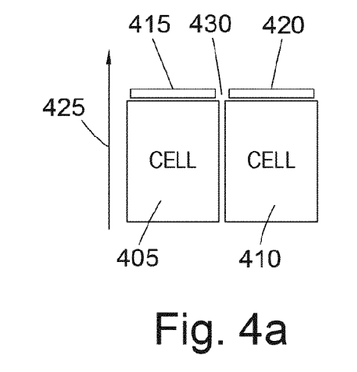
FIG. 4a depicts two cells of a 3D NAND structure as implemented on a substrate, with peri-lines perpendicular to a scanning exposure direction.
Figure 4B:
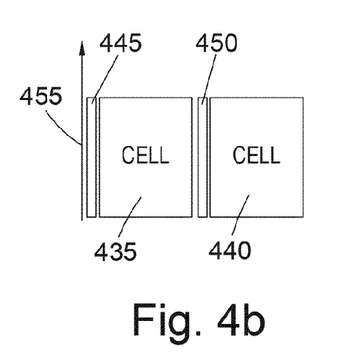
FIG. 4b depicts two cells of a 3D NAND structure as implemented on a substrate, with peri-lines parallel to a scanning exposure direction.

A correspondence between detection of the peri-lines and strokes of the level sensor is illustrated in more detail in FIGS. 4*a* and 4*b*.

FIG. 4*a* depicts two cells 405, 410, for example memory cells implemented in a 3D NAND structure, as implemented on a substrate. Each cell has a corresponding peri-line 415, 420. The peri-lines 415, 420 run substantially parallel to the x-direction, and thus are orthogonal to the scanning exposure direction. As such, with strokes of the level sensors in a scanning exposure direction denoted by arrow 425, any particular measurement spot may either cross the peri-lines 415, 420, and thus detect the peri-lines, or fall within gaps 430 between the peri lines 415, 420 and thus fail to detect the peri-lines 415, 420.

Similarly, FIG. 4*b* depicts two cells 435, 440, wherein each cell has a corresponding peri-line 445, 450. The peri-lines 445, 450 run substantially parallel to the scanning exposure direction. As such, with strokes of the level sensors also in the scanning exposure direction denoted by arrow 455, any particular measurement spot may either extend along the peri-lines 445, 450 and thus detect the peri-lines 445, 450, or fall between the peri lines 445, 450 and thus fail to detect the peri-lines 445, 450.

Figure 4C:
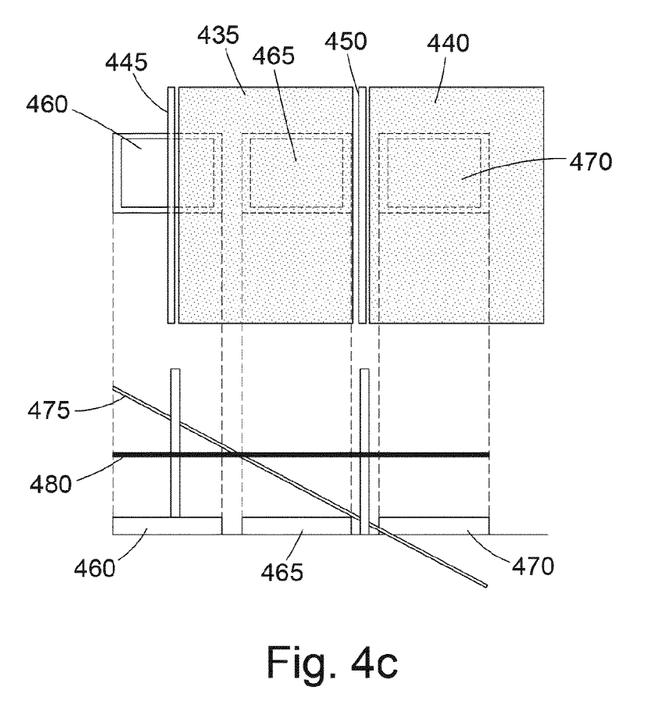
FIG. 4c depicts the cells of FIG. 4b relative to measurement spots of a level sensor.

Continuing with the example of FIG. 4*b*, FIG. 4*c* depicts the two cells 435, 440 with corresponding peri-lines 445, 450. Also shown is a first measurement spot 460, a second measurement spot 465, and a third measurement spot 470—all exemplary. Continuing with the above-described example, the first, second and third measurement spots 460, 465, 470 may correspond to 3 out of a greater number of measurement spots. The first measurement spot 460 spans the peri-line 445, and thus the peri-line 445 would be clearly detected. The second measurement spot 465 and the third measurement spot 470 straddle the peri-line 450. As such, peri-line 450 is not detected. The top part of FIG. 4*c* is a view from above, and the bottom part is a cross-sectional view with the lines 475 and 480 representing the position of the areal image of the exposed reticle with respect to the product topography. As such, approximate exposure profile 475 from a level sensor measurement based upon the first, second and third measurement spots 460, 465, 470 is depicted relative to an optimal exposure profile 480 that could be achieved if each cell 435, 440 and its associated peri-line 445, 450 was equally measured by the first, second and third measurement spots 460, 465, 470.

Figure 5:
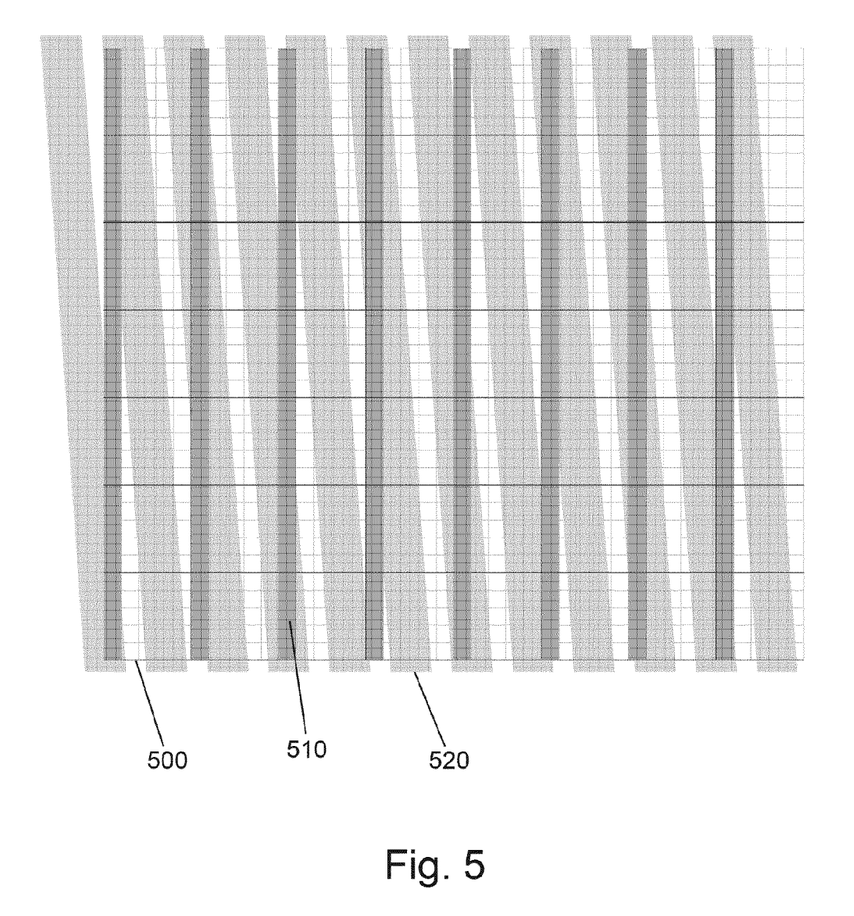
FIG. 5 depicts an implementation of slanted level sensor strokes, according to an embodiment of the disclosure

FIG. 5 depicts an implementation of slanted level sensor strokes, according to a first embodiment of the disclosure.

Such slanted level sensor strokes may be implemented by a lithographic apparatus comprising at least one substrate table configured to support a substrate, and actuators configurable to move the substrate table in a plane substantially parallel to the surface of the substrate, as described above with reference to FIG. 1. Furthermore, such a lithographic apparatus would comprise a projection system configured to pattern the substrate with fields aligned in a scanning exposure direction, a level sensor configured to sense a height of the substrate using a plurality of measurement spots, and a controller configured to control the actuators to generate strokes of relative movement between the substrate and the level sensor for mapping the height of the substrate. In the example embodiment of FIG. 5, the strokes are at an angle of less than 20 degrees relative to the scanning exposure direction, as described in more detail below.

The example of FIG. 5 depicts a grid 500 corresponding to fields patterned onto a portion of a substrate. The fields on the grid 500 are defined by, and thus aligned with, the scanning exposure direction. In an example embodiment, each field corresponds to a plurality of dies in the x and y directions. For example, each field may correspond to 3×5 dies, or the like. Also depicted are lines 510 corresponding to scribes lines or significant topological features of the fields.

Also depicted is a portion of a stroke of a level sensor. Continuing with the above-described example of a level sensor having a given number of measurement spots, FIG. 5 depicts measurement paths 520 taken by a subset of the measurement spots over a portion of a single stroke of the level sensor. That is, FIG. 5 depicts measurement paths 520 taken by 12 of the given number of measurement spots over a portion of a single stroke of the level sensor over a portion of the grid 500 of fields on a substrate. Although only a portion of a single stroke is depicted in FIG. 5 for purposes of clarity, it will be understood that a plurality of strokes would be required to measure a height of a majority of a surface of the substrate. Each of the strokes would be substantially parallel to each other one of the strokes, such that all of the measurement paths taken by the measurement spots are substantially parallel to each other.

Each of the measurement paths 520 is at an angle relative to lines 510 corresponding to scribe lines or topological features of the fields, e.g. to the scanning exposure direction. That is, each of the measurement paths 520 is slanted relative to the scanning exposure direction, as shown in FIG. 5. In some embodiments, the angle is less than 1 degree. In some embodiments a position of the strokes in a first direction orthogonal to the scanning exposure direction, e.g. the x-direction, varies by between 1 and 2 times a pitch between each of the plurality of measurement spots, over a length of the substrate table. For example, for a pitch between each of a plurality of measurement spots where the width or diameter of each measurement spot is a given length L, the position of the strokes in the x-direction would vary by approximately L to 2L over a length of the substrate table, or preferably over a length of the substrate. An advantageous benefit of the slanted measurement direction relative to the scanning exposure direction is that the repeating device topology of the fields is measured at a plurality of different x-positions by at least one level sensor measurement spot.

By combining the measurements of all fields it is possible to reconstruct the device topology, e.g. a height map, with a resolution having a smaller pitch than the pitch between the LS spots. Furthermore, by using such slanted measurement spots, all scribe lines or significant topological features of the fields would be detected, thus making the measurement of the device topology more accurate. In some embodiments, a reconstruction of the device topology from data corresponding to the slanted measurements may be performed by a processor.

In an embodiment of the disclosure, the controller, e.g. the controller CT depicted in FIG. 1, is configured to control the plurality of actuators to move the substrate table relative to the level sensors in the y-direction and in the x-direction at the same time, such that measurement paths of the level sensor are slanted relative to the scanning exposure direction.

In an embodiment of the disclosure, the controller is configured to control the plurality of actuators to move the substrate table relative to the level sensors in the scanning exposure direction faster than the plurality of actuators is configured to move the substrate table relative to the level sensors in the x-direction. That is, the example of FIG. 1, actuator AY may be configured to move the substrate table in the Y-direction faster than actuator AX is configured to move the substrate table in the X-direction. In some embodiments, the actuator AX configured to move the substrate table in the x-direction will only increase an overall scan speed by a factor of less than 1.00002.

In a further embodiment of the disclosure, the controller may be additionally configured to vary a position of the strokes in the x-direction between consecutive strokes. As such, a likelihood of scribe lines or significant topological features of the fields remaining undetected by the level sensor is reduced. That is, for topological features that are repeated at a distance corresponding to a multiple of the pitch between measurement spots, a variation in a position of the strokes in the x-direction between consecutive strokes helps to ensure such features are reliably detected.

Figure 6:
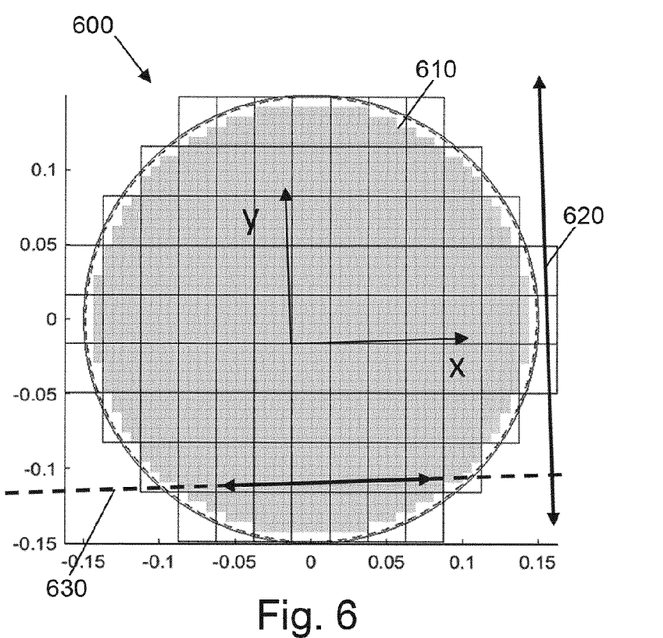
FIG. 6 depicts an example map of a substrate showing directions of strokes of the level sensor relative to a scanning exposure direction, according to a further embodiment of the disclosure.

A further embodiment of the disclosure is described with reference to FIG. 6. FIG. 6 depicts an example map 600 of a substrate. The map 600 covers a plurality of fields 610, each field 610 being substantially quadrilateral in shape and provided in a grid-like arrangement covering a majority of an overall surface of the substrate.

Each field 610 may correspond to a pattern, for example, a pattern that has been projected onto the substrate using a radiation beam B as described above with reference to the substrate W and projection system PS of FIG. 1. That is, each field 610 may correspond to at least one layer or a portion of an integrated circuit or electronic device that has been patterned onto the substrate. In a typical lithographic process, each field 610 on the substrate is substantially identical to each other field.

As can be seen in FIG. 6, the substrate is rotated such that strokes of the level sensor in the y-direction are at an angle of less than 20 degrees relative to the scanning exposure direction.

For example, in some embodiments the controller, e.g. controller CT, may configure the actuator AR to rotate the substrate relative to the level sensors. Subsequently the controller may configure actuators, e.g. actuators AX and AY, to generate strokes of relative movement between the substrate and the level sensor for mapping the height of the substrate, wherein said strokes are at an angle of less than 20 degrees relative to the scanning exposure directions.

Arrow 620 depicts a direction of strokes of the level sensor. The strokes are parallel to the y-axis and thus at an angle to the scanning exposure direction due to a rotation of the substrate. Thus, any deep scribe line or significant topological feature of a field that runs substantially parallel to the scanning exposure direction would be detected during level sensor measurements, because a path of at least one measurement spot would cross said deep scribe line or significant topological feature.

Also depicted is an arrow 630 which depicts a calibration scan stroke. The calibration scan stroke is parallel to the x-axis and thus at an angle relative to a direction orthogonal to the scanning exposure direction, due to rotation of the substrate. Thus, beneficially the calibration stroke would be less likely to run along a deep scribe line or a significant topological feature that extends across the substrate in a direction orthogonal to the scanning exposure direction.

In yet further embodiments of the disclosure, the above-described embodiments may be combined. For example, in some embodiments, the controller is configured to control the plurality of actuators to move the substrate table relative to the level sensors in the y-direction and in the x-direction at the same time to provide slanted measurement paths of the level sensor relative to the scanning exposure direction, in addition to the substrate also having been rotated.

As described with reference to FIGS. 7a and 7b, rotation of the substrate to provide strokes of relative movement between the substrate and the level sensor at an angle of less than 20 degrees relative to the scanning exposure direction may also beneficially reduce errors due to noise. Such noise may be prevalent due to vibrations in the lithographic apparatus, which are detected as variations in the height of the substrate by the level sensor.

Figure 7A:
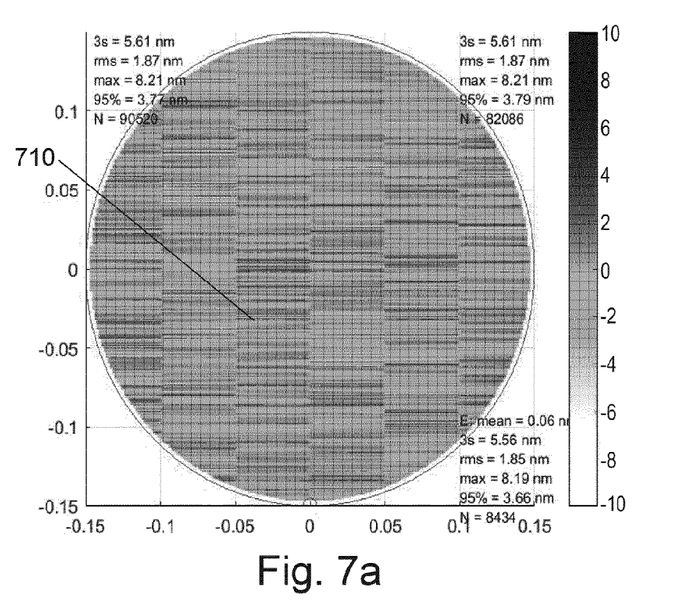
FIG. 7a depicts vibrational noise on a height map of a substrate sensed using a level sensor, wherein strokes of the level sensor relative to the substrate were parallel to the scanning exposure direction.

FIG. 7a depicts an example of a height map of a substrate sensed using a level sensor, wherein all six strokes of the level sensor relative to the substrate were parallel to the scanning exposure direction. Horizontal lines 710 in each of the six strokes correspond, at least in part, to vibrations in the substrate causing variations in a sensed height of the substrate.

Due to characteristics of the fields pattered onto the substrate, topological features of the fields may be generally aligned with the lines caused by vibrations of the substrate. As such, it can be difficult to accurately filter out or compensate for such vibrations because any such filtering or compensation may also filter out or compensate for topological features of the fields.

Figure 7B:
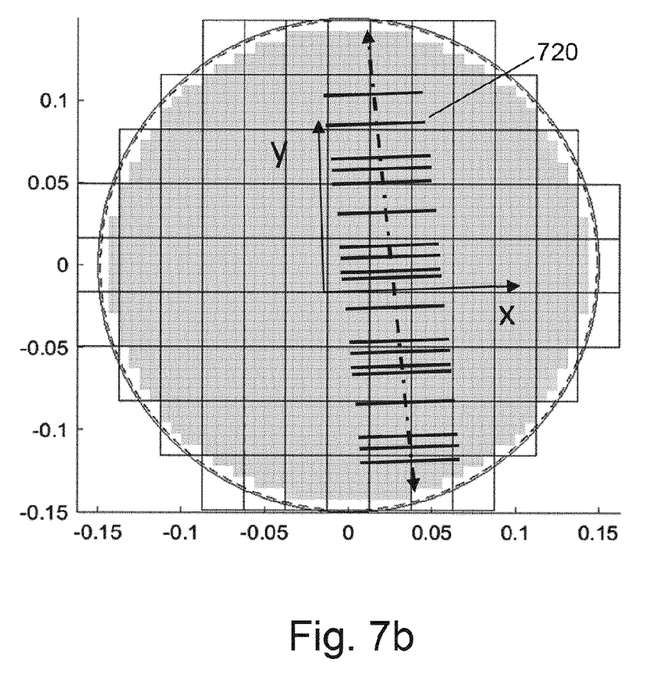
FIG. 7b depicts vibrational noise on a height map of a substrate sensed using a level sensor, wherein strokes of the level sensor relative to the substrate were at an angle relative to the scanning exposure direction, in accordance with an embodiment of the disclosure.

Thus, by rotating the substrate as depicted in FIG. 7b such that strokes of relative movement between the substrate and the level sensor for mapping the height of the substrate are an angle of less than 20 degrees relative to the scanning exposure direction, detected vibrations 720 may not be fully aligned with topological features of the fields, and thus may be more easily compensated for or filtered out.

Figure 8:
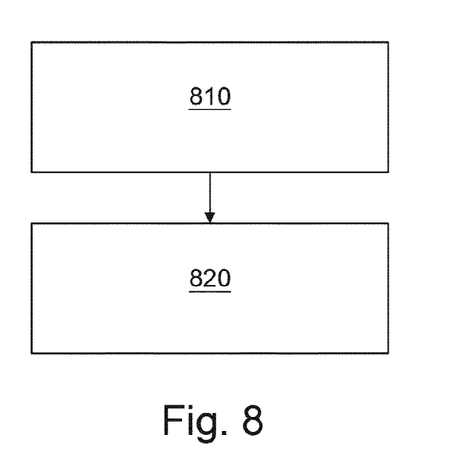
FIG. 8 depicts a block diagram of a method of mapping the height of a substrate.

FIG. 8 depicts a method of mapping the height of a substrate, the method comprising a step 820 of controlling actuators to generate strokes of relative movement between a substrate supported by a substrate table and a level sensor for mapping the height of the substrate using a plurality of measurement spots, said strokes at an angle of less than 20 degrees relative to fields aligned on the substrate in a scanning exposure direction.

The method comprises a preceding step 810 of rotating the substrate table such that said strokes are at the angle of less than 20 degrees relative to the scanning exposure direction.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A lithographic apparatus comprising:
   a substrate table configured to support a substrate;
   actuators configurable to move the substrate table in a plane substantially parallel to a main surface of the substrate;
   a projection system configured to pattern the substrate with fields aligned in a scanning exposure direction;
   a level sensor configured to sense a height of the substrate using a plurality of measurement spots along a plurality of measurement paths; and
   a controller configured to control the actuators to generate strokes of relative movement between the substrate and the level sensor configured to map the height of the substrate, all of the strokes being at a non-zero angle of less than 20 degrees relative to the scanning exposure direction such that all of the measurement paths are slanted relative to the scanning exposure direction.

2. The apparatus of claim 1, wherein the strokes are substantially parallel to each other.

3. The apparatus of claim 1, wherein a position of the strokes in a first direction orthogonal to the scanning exposure direction varies by between 1 and 2 times a pitch between each of the plurality of measurement spots, over a length of the substrate table.

4. The apparatus of claim 3, wherein the controller is configured to control the actuators to move the substrate table relative to the level sensor in the scanning exposure direction faster than the actuators are configured to move the substrate table relative to the level sensor in the first direction.

5. The apparatus of claim 1, wherein the controller is configured to vary a position of the strokes in a first direction orthogonal to the scanning exposure direction between consecutive strokes.

6. The apparatus of claim 1, wherein the non-zero angle is less than 1 degree.

7. A method of mapping the height of a substrate, the method comprising:
   controlling actuators to generate strokes of relative movement between a substrate supported by a substrate table and a level sensor for mapping the height of the substrate using a plurality of measurement spots along a plurality of measurement paths, all of the strokes being at a non-zero angle of less than 20 degrees relative to the scanning exposure direction such that all of the measurement paths are slanted relative to the scanning exposure direction.

8. The method of claim 7, further comprising a step of combining a plurality of measurements of the height of the substrate to reconstruct a topology of the substrate and/or to compute an intra-field fingerprint.

9. The method of claim 8, wherein the strokes are substantially parallel to each other.

10. The method of claim 7, further comprising a step of varying a position of the strokes in a first direction orthogonal to the scanning exposure direction by between 1 and 2 times a pitch between each of a plurality of measurement spots of the level sensor, over a length of the substrate table.

11. The method of claim 10, further comprising a step of moving the substrate relative to the level sensor in the scanning exposure direction faster than the substrate is moved relative to the level sensor in the first direction.

12. The method of claim 7, further comprising a step of varying a position of the strokes in a first direction orthogonal to the scanning exposure direction between consecutive strokes.

13. A computer program product comprising non-transitory instructions that, when the program is executed by a computer, cause the computer to control actuators to carry out a method of mapping a height of a substrate, the method comprising:
   controlling the actuators to generate strokes of relative movement between a substrate supported by a substrate table and a level sensor for mapping the height of the substrate using a plurality of measurement spots along a plurality of measurement paths, all of the strokes being at a non-zero angle of less than 20 degrees relative to the scanning exposure direction such that all of the measurement paths are slanted relative to the scanning exposure direction.

* * * * *

UNITED STATES PATENT AND TRADEMARK OFFICE
CERTIFICATE OF CORRECTION

PATENT NO. : 12,339,594 B2
APPLICATION NO. : 18/032448
DATED : June 24, 2025
INVENTOR(S) : De Nivelle et al.

Page 1 of 1

It is certified that error appears in the above-identified patent and that said Letters Patent is hereby corrected as shown below:

In the Claims

In Column 14, Claim 7, Line 16, delete "the" and insert -- a --, therefor.

In Column 14, Claim 7, Line 23, delete "being" and insert -- being arranged --, therefor.

In Column 14, Claim 7, Line 24, delete "to the" and insert -- to fields aligned on the substrate in a --, therefor.

In Column 14, Claim 13, Line 56, delete "being" and insert -- being arranged --, therefor.

In Column 14, Claim 13, Line 57, delete "to the" and insert -- to fields aligned on the substrate in a --, therefor.

Signed and Sealed this
Twenty-ninth Day of July, 2025

Coke Morgan Stewart
*Acting Director of the United States Patent and Trademark Office*